United States Patent
Kwak

(10) Patent No.: US 6,825,703 B1
(45) Date of Patent: Nov. 30, 2004

(54) DELAY LOCKED LOOP AND METHOD OF DRIVING THE SAME

(75) Inventor: Jong Tae Kwak, Ichon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/654,498

(22) Filed: Sep. 3, 2003

(30) Foreign Application Priority Data

Jun. 27, 2003 (KR) ........................................ 2003-42423

(51) Int. Cl.[7] .............................................. H03L 7/06
(52) U.S. Cl. ..................................... 327/158; 327/149
(58) Field of Search ................................. 327/158, 149, 327/153, 156, 161, 236, 152, 141; 375/373, 376

(56) References Cited

U.S. PATENT DOCUMENTS 6,417,706 B2 * 7/2002 Kondo ........................ 327/158
6,483,359 B2 * 11/2002 Lee ............................ 327/158

* cited by examiner

*Primary Examiner*—Linh My Nguyen
(74) *Attorney, Agent, or Firm*—Marshall, Gerstein & Borun LLP

(57) ABSTRACT

Disclosed are a delay locked loop (DLL) and a method of driving the same. The delay locked loop includes a clock buffer for buffering an inputted external clock to generate an internal clock, the clock buffer generating a control signal for disabling the internal clock depending on whether the power is down, a delayed line for delaying the internal clock, a clock driver for buffering the output of the delayed line to generate a clock signal, the clock driver disabling the clock signal depending on whether the power is down, a delay monitor for delaying the external clock, a phase detector for detecting the difference in a phase between the internal clock and the output of the delayed monitor to generate a detected signal, the phase detector being disabled according to the control signal, and a shift register for controlling the delayed line according to the detected signal from the phase detector. Therefore, it is possible to sufficiently satisfy power down excitation time while reducing current consumption of the entire semiconductor device during the power down state.

9 Claims, 2 Drawing Sheets

DELAY LOCKED LOOP AND METHOD OF DRIVING THE SAME

BACKGROUND OF THE INVENTION

The present invention relates to a delay locked loop (DLL) and a method of driving the same, and more particularly, to a delay locked loop (DLL) and a method of driving the same, which can reduce power consumption.

In general, a clock in the system or the circuit is used as a reference for matching the operating timing. The clock is also used to secure much faster operation without error. When the clock externally inputted is used internally, time delay (clock skew) by the internal circuit occurs. In order to compensate for such time delay and thus make the internal clock have the same phase as the external clock, a delay locked loop (DLL) is used.

Meanwhile, the DLL has the advantage that it is less sensitive to noise than the phase locked loop (PLL) that has been conventionally used. For this reason, the DLL has been widely used for a synchronous semiconductor memory including DDR SDRAM (double data rate synchronous DRAM). Of them, a register controlled DLL has been widely utilized.

As the time taken to exit an active power down mode is tCD, it can sufficiently satisfy active power down excitation time rules.

The clock outputted from the DLL is used only when the DRAM receives the read command. In other words, if the read command is not applied, the DLL continues to perform a locking operation. Actually, the output of the DLL is not at all used.

From the DDR II SDRAM, the power down mode is classified into two types in which the power down excitation time is differently specified for each of the two types. In other words, the power down mode is classified into an active power down mode and a precharge power down mode. As the active power down mode bank is active, the read operation can be performed directly after power-down excitation. On the contrary, after the precharge power down mode is excited, the active command is applied to activate the bank and the read operation is then performed. Therefore, a certain time is taken in using the output of the DLL. For this reason, in the DDR II SDRAM rules, the active power down excitation time is 2 cycles but the precharge down excitation time is 6 cycles.

The DLL used in the conventional synchronous DRAM will now be described with reference to FIG. 1.

A clock buffer 10 for buffering an external clock CLK to generate an internal clock CLKin is provided. The internal clock CLKin is delayed in a delayed line 20 for a certain time and is then inputted to a clock driver 30. The clock driver 30 buffers the internal clock CLKin delayed in the delayed line 20 to generate a clock signal CLKout.

A delayed monitor 60 having the same delay path as the external clock CLK is provided. The clock signal CLKout is delayed in the delayed monitor 60 and is then inputted to a phase detector 40. The phase detector 40 detects the difference in a phase between the clock signal CLKout via the delayed monitor 60 and the internal clock CLKin to generate shift control signals shift-left and shift-right. A shift register 50 determines a delay time of the delayed line 20 according to the shift control signals shift-left and shift-right. In other words, if the shift control signal shift-left is inputted to the shift register 50, the register moves left. On the contrary, if the shift control signal shift-right is inputted to the shift register 50, the register moves right. Delay is fixed at the time when the clock signal CLKout via the delayed monitor 60 and the internal clock CLKin have the minimum jitter.

In the DDR or DDR II SDRAM to which such a DLL is applied, however, the DLL is entirely operated regardless of the power down mode to consume the current. Due to this, lots of the power is consumed. This reason will be described as follows.

In the DDR or DDR II SDRAM, as the active power down excitation time (time taken to exit from the power down mode to the normal mode) is very short, about 2 cycles, the DLL cannot be completely turned off even in the active power down mode. In other words, if it is required that a DLL clock be outputted after the DLL is completely turned off during the active power down mode, the active power down mode has to pass through the clock buffer 10, the delayed line 20 and the clock driver 30, as described above. Assuming that the delay time of the clock buffer 10 is tCB, the delay time of the delayed line 20 is tDL and the delay time of the clock driver 30 is tCD, tCB+tDL+tCD is significantly higher than the power down excitation time (about 2 cycles). Therefore, in the prior art, lots of the power is consumed since the DLL is entirely operated even in the active power down mode.

SUMMARY OF THE INVENTION

An object of the present invention is to provide a delay locked loop (DLL) and a method of driving the same capable of solving the aforementioned problems.

Another object of the present invention is to provide a delay locked loop (DLL) and a method of driving the same, which can satisfy the active power down excitation time while reducing power consumption, by partially turning off the DLL while keeping locking information of the DLL itself during the active power down mode.

According to one aspect of the present invention for achieving the object, there is provided a delay locked loop, including a clock buffer for buffering an inputted external clock to generate an internal clock, the clock buffer generating a control signal for disabling the internal clock depending on whether the power is down, a delayed line for delaying the internal clock, a clock driver for buffering the output of the delayed line to generate a clock signal, the clock driver disabling the clock signal depending on whether the power is down, a delay monitor for delaying the external clock, a phase detector for detecting the difference in a phase between the internal clock and the output of the delayed monitor to generate a detected signal, the phase detector being disabled according to the control signal, and a shift register for controlling the delayed line according to the detected signal from the phase detector.

According to another aspect of the present invention, there is provided a method of driving a delay locked loop, including the steps of in an active power down mode, disabling the phase detector, the shift register and the clock driver, while keeping an enable state of the clock buffer and the delayed line, at the time of active power down excitation, enabling the disabled phase detector, the shift register and the clock driver, in a precharge power down mode, disabling the clock buffer, the delayed line, the clock driver, the delayed monitor, the phase detector and the shift register, and at the time of precharge power down excitation, enabling the clock buffer, the delayed line, the clock driver, the delayed monitor, the phase detector and the shift register.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE INVENTION

Hereinafter, a delay locked loop (DLL) and a method of driving the same according to embodiments of the present invention will be described in detail with reference to the accompanying drawings.

Figure 1:
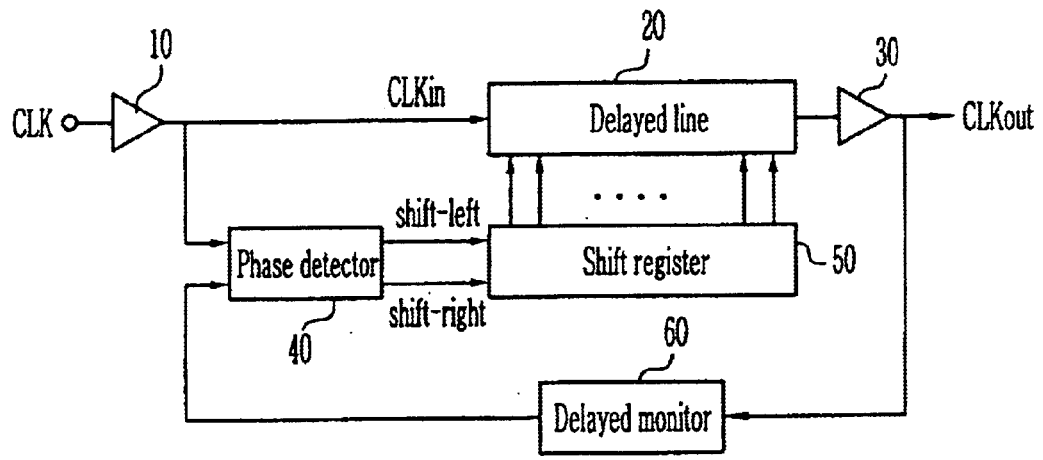
FIG. 1 is a block diagram illustrating a conventional delay locked loop.
Figure 2:
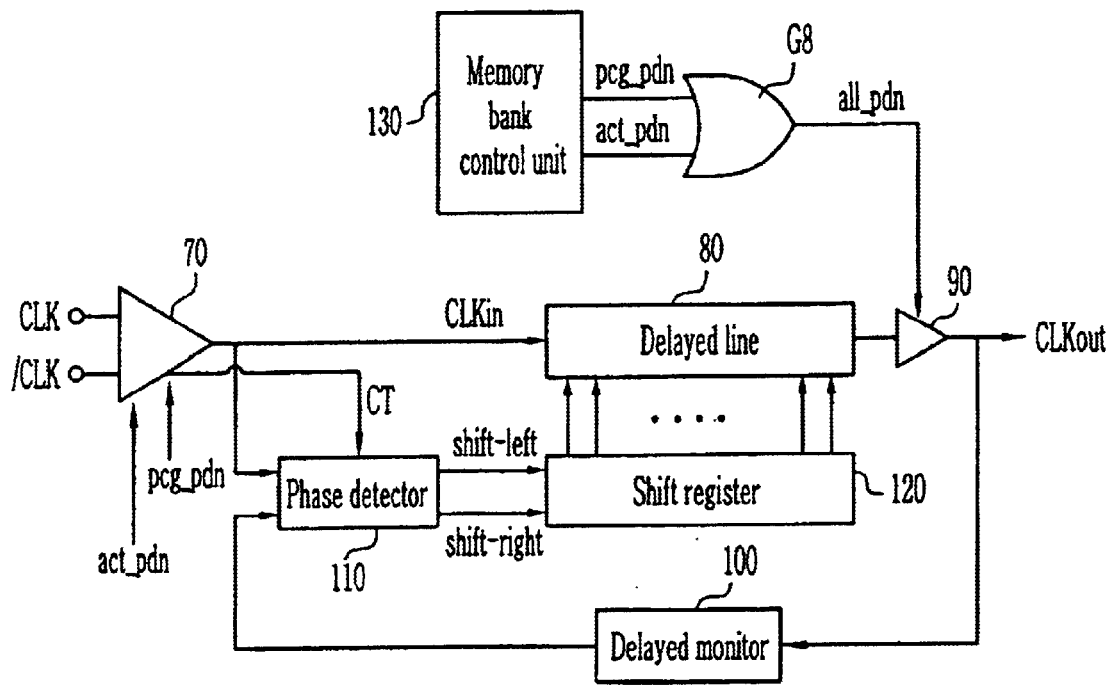
FIG. 2 is a block diagram illustrating a delay locked loop according to an embodiment of the present invention.

FIG. 2 is a block diagram illustrating the delay locked loop (DLL) according to the embodiment of the present invention.

There is provided a clock buffer 70 for buffering external clocks CLK and /CLK to generate an internal clock CLKin and a control signal CT. The internal clock CLKin is delayed in a delayed line 80 for a certain time and is then inputted to a clock driver 90. The clock driver 90 buffers the internal clock CLKin delayed in the delayed line 80 to generate a clock signal CLKout.

Meanwhile, a memory bank control unit 130 outputs a precharge power down signal pcg_pdn and an active power down signal act_pdn. The precharge power down signal pcg-pdn is a signal that is enabled in the case where it enters the power down state in a state where a word line path within the bank in the synchronous DRAM such as the DDR SDRAM is shut. The active power down signal is a signal that is enabled in the case where it enters the power down state in a state where the word line path within the bank in the synchronous DRAM such as the DDR SDRAM is activated.

An OR gate G8 logically combines the precharge power down signal pcg_pdn and the active power down signal act_pdn to output a clock driver control signal all_pdn. If either the precharge power down signal pcg_pdn or the active power down signal act_pdn is in a HIGH state, the clock driver control signal all_pdn becomes the HIGH state.

Figure 3:
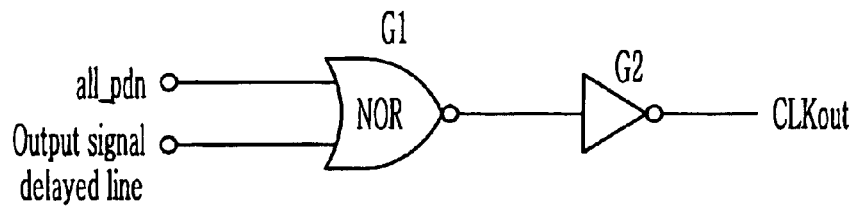
FIG. 3 is a detailed circuit diagram illustrating the clock driver shown in FIG. 2.

The clock driver 90 is constructed as shown in FIG. 3. The clock driver control signal all_pdn and the output signal of the delayed line 80 are logically combined in a NOR gate G1. If the clock driver control signal all_pdn is in a HIGH state, the output of the NOR gate G1 becomes a LOW state regardless of the output of the delayed line 80. Also, as the LOW state is inverted in an inverter G2, the clock signal CLKout being the output of the clock driver 90 is disabled to become a HIGH state. On the contrary, if the clock driver control signal all_pdn is in a LOW state, the output of the NOR gate G1 outputs a signal that inverted the output of the delayed line 80. This signal is again inverted in the inverter G2, so that the clock signal CLKout being the output of the clock driver 90 is generated.

There is provided a delayed monitor 100 having the same delay path as the external clock CLK. The clock signal CLKout is delayed in the delayed monitor 100 and is then inputted to a phase detector 110. The phase detector 110 detects the difference in the phase between the clock signal CLKout through the delayed monitor 110 and the internal clock CLKin to generate shift control signals shift-left and shift-right. A shift register 120 decides the delay time of the delayed line 80 according to the shift control signals shift-left and shift-right. In other words, if the shift control signal shift-left is inputted to the shift register 120, the register moves left. On the contrary, if the shift control signal shift-right is inputted to the shift register 120, the register moves right. Delay is fixed at the time when the clock signal CLKout through the delayed monitor 100 and the internal clock CLKin have the minimum jitter.

However, the operation of the phase detector 110 is controlled by the control signal CT outputted from the clock buffer 70. For example, if the control signal CT is in a HIGH state, the operation of the phase detector 110 is shut. If the operation of the phase detector 110 is shut, the shift register 120 does not operate.

Figure 4:
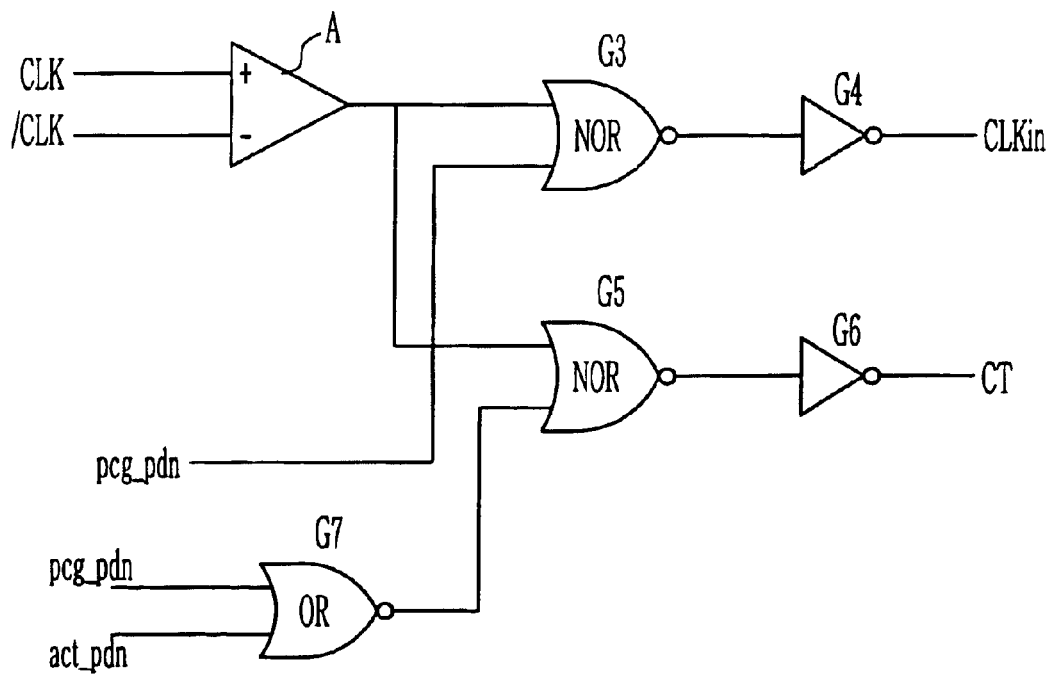
FIG. 4 is a detailed circuit diagram illustrating the clock buffer shown in FIG. 2.

Detailed construction and operation of the clock buffer 70 will now be described with reference to FIG. 4.

The clock signals CLK and /CLK are amplified in an amplifier A and are then converted into the clock signals the waveforms of which are shaped. A NOR gate G3 logically combines the clock shaped in the amplifier A and the precharge power down signal pcg_pdn. For example, if the precharge power down signal pcg_pdn is in a HIGH state, the output of the NOR gate G3 becomes a LOW state regardless of the output of the amplifier A. As this LOW state is inverted in an inverter G4, the internal clock CLKin is disabled to become a HIGH state. Therefore, the delayed line 80 is disabled. On the contrary, if the precharge power down signal pcg_pdn is in a LOW state, the output of the amplifier A is inverted in the NOR gate G3 and is again inverted in the inverter G4, thus becoming an internal clock CLKin.

Further, the precharge power down signal pcg_pdn and the active power down signal pcg_pdn and act_pdn are logically combined in an OR gate G8. If either the precharge power down signal pcg_pdn or the active power down signal act_pdn becomes a HIGH state, the output of the OR gate G7 becomes the HIGH state. The output of the amplifier A and the output of the OR gate G7 are logically combined in a NOR gate G5. If the output of the OR gate G7 is in a HIGH state, the output of the NOR gate G5 becomes a LOW state regardless of the output of the amplifier A. As this LOW state is inverted in the inverter G6 to become a HIGH state, the control signal CT is disabled to become a HIGH state. A phase detector 110 controlled by the control signal CT is disabled.

Based on the above explanation, the operation of the DLL according to the present invention in the respective modes in the synchronous DRAM such as the DDR SDRAM will now be described in detail.

A. Precharge Power Down Mode

In the precharge power down mode, only the precharge power down signal pcg_pdn becomes a HIGH state. As described with reference to FIG. 4, in this state, as the internal clock CLKin and the control signal CT are disabled to become the HIGH state, i.e., the clock buffer 70 shuts the input of the clock thereto, the DLL completely enters into a dormant state only with previous locking information. In this state, power consumption of the DLL becomes nearly zero (0).

The rules of the time taken to exit the precharge power down mode is about 6 clocks. As tCB+tDL+tCD is set within 2 clocks, there is nothing problem to exit the precharge power down mode.

B. Active Power Down Mode

In the active power down mode, only the active power down signal act_pdn becomes a HIGH state. As described with reference to FIG. 4, in this state, as the control signal CT is disabled and the internal clock CLKin is enabled, only the clock buffer 70 and the delayed line 80 consume the power. In other words, the internal clock of the DLL reaches the input of the clock driver 90 only with previous locking information via the clock buffer 70 and the delayed line 80, and all the other locking operations are not performed. Therefore, the power can be significantly reduced and the DLL clock can be provided within a short time when the clock is excited in the power down state.

According to the present invention described above, the present invention has a new effect that it can sufficiently satisfy power down excitation time while reducing current consumption of the entire semiconductor device during a power down state.

Further, as a part of the DLL is operated during the power down state, it is possible to significantly reduce power noise at the time of a power down excitation state.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A delay locked loop, comprising:
   a clock buffer for buffering an inputted external clock to generate an internal clock, the clock buffer generating a control signal for disabling the internal clock depending on whether the power is down;
   a delayed line for delaying the internal clock;
   a clock driver for buffering the output of the delayed line to generate a clock signal, the clock driver disabling the clock signal depending on whether the power is down;
   a delay monitor for delaying the external clock;
   a phase detector for detecting the difference in a phase between the internal clock and the output of the delayed monitor to generate a detected signal, the phase detector being disabled according to the control signal; and
   a shift register for controlling the delayed line according to the detected signal from the phase detector.

2. The delay locked loop as claimed in claim 1, wherein the clock buffer comprises:
   an amplifier for buffering the external clock;
   a first means for generating or disabling the internal clock depending on whether the power is down; and
   a second means for generating the control signal depending on whether the power is down.

3. The delay locked loop as claimed in claim 2, wherein the first means comprises:
   a NOR gate for receiving the output of the amplifier and a signal generated when the power is down as an input; and
   an inverter for inverting the output of the NOR gate.

4. The delay locked loop as claimed in claim 2, wherein the second means comprises:
   a NOR gate for receiving the output of the amplifier and a signal generated when the power is down as an input; and
   an inverter for inverting the output of the NOR gate.

5. The delay locked loop as claimed in claim 1, wherein the clock driver comprises:
   a NOR gate for receiving a signal generated when the power is down and the output of the delay locked loop as an input; and
   an inverter for inverting the output of the NOR gate.

6. A delay locked loop, comprising:
   a clock buffer for buffering an inputted external clock to generate an internal clock, the clock buffer disabling the internal clock depending on a precharge power down signal and generating a control signal depending on the precharge power down signal or an active power down signal;
   a delayed line for delaying the internal clock;
   a clock driver for buffering the output of the delayed line to generate a clock signal, the clock driver disabling the clock signal depending on the precharge power down signal or the active power down signal;
   a delay monitor for delaying the external clock;
   a phase detector for detecting the difference in a phase between the internal clock and the output of the delayed monitor to generate a detected signal, the phase detector being disabled according to the control signal; and
   a shift register for controlling the delayed line according to the detected signal from the phase detector.

7. The delay locked loop as claimed in claim 6, wherein the clock buffer comprises:
   an amplifier for buffering the external clock;
   a first NOR gate to which the precharge power down signal and the output of the amplifier are inputted;
   a first inverter for inverting the output of the first NOR gate;
   an OR gate to which the precharge power down signal and the active power down signal are inputted;
   a second NOR gate to which the output of the OR gate and the output of the amplifier are inputted; and
   a second inverter for inverting the output of the second NOR gate.

8. The delay locked loop as claimed in claim 6, wherein the clock driver comprises:

a NOR gate to which the output of the delayed line and the precharge power down signal or the active power down signal are inputted; and an inverter for inverting the output of the NOR gate.

9. A method of driving a delay locked loop, the delay locked loop having a clock buffer for buffering an external clock to generate an internal clock, a delayed line for delaying the internal clock for a certain time, a clock driver for buffering the output of the delayed line to generate a clock signal, a delayed monitor for delaying the clock signal, a phase detector for detecting the difference in a phase between the output of the delayed monitor and the internal clock, and a shift register for controlling the delayed line according to the output of the phase detector, the method comprising the steps of:

in an active power down mode, disabling the phase detector, the shift register and the clock driver, while keeping an enable state of the clock buffer and the delayed line;

at the time of active power down excitation, enabling the disabled phase detector, shift register and clock driver;

in a precharge power down mode, disabling the clock buffer, the delayed line, the clock driver, the delayed monitor, the phase detector and the shift register; and at the time of precharge power down excitation, enabling the clock buffer, the delayed line, the clock driver, the delayed monitor, the phase detector and the shift register.

* * * * *

UNITED STATES PATENT AND TRADEMARK OFFICE
CERTIFICATE OF CORRECTION

PATENT NO. : 6,825,703 B1
DATED : November 30, 2004
INVENTOR(S) : Jong T. Kwak

It is certified that error appears in the above-identified patent and that said Letters Patent is hereby corrected as shown below:

Title page,
Item [75], Inventors, after "Jong Tae Kwak" please delete "Ichon-Shi" and insert -- Kyungki-do -- in its place.

Signed and Sealed this

Seventeenth Day of May, 2005

JON W. DUDAS
*Director of the United States Patent and Trademark Office*